United States Patent
Chen et al.

(10) Patent No.: US 8,129,797 B2
(45) Date of Patent: Mar. 6, 2012

(54) WORK FUNCTION ENGINEERING FOR EDRAM MOSFETS

(75) Inventors: Xiangdong Chen, Poughquag, NY (US); Herbert L. Ho, New Windsor, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 824 days.

(21) Appl. No.: 12/141,311

(22) Filed: Jun. 18, 2008

(65) Prior Publication Data

US 2009/0315124 A1    Dec. 24, 2009

(51) Int. Cl.
*H01L 27/088* (2006.01)

(52) U.S. Cl. ........ 257/392; 257/296; 257/410; 257/412; 257/E21.439

(58) Field of Classification Search .................. 257/392, 257/296, 410, 412, E21.439; 438/275
See application file for complete search history.

(56) References Cited

U.S. PATENT DOCUMENTS

| | | | |
|---|---|---|---|
| 6,373,111 B1 | 4/2002 | Zheng et al. | |
| 6,653,698 B2 | 11/2003 | Lee et al. | |
| 6,902,969 B2 * | 6/2005 | Adetutu et al. | 438/199 |
| 7,524,707 B2 * | 4/2009 | Adetutu et al. | 438/150 |
| 7,646,067 B2 * | 1/2010 | Nam et al. | 257/369 |
| 2006/0237796 A1 | 10/2006 | Cartier et al. | |
| 2006/0263965 A1 | 11/2006 | Yates | |
| 2007/0138563 A1 | 6/2007 | Callegari et al. | |
| 2007/0173008 A1 | 7/2007 | Chudzik et al. | |
| 2007/0228458 A1 | 10/2007 | Henson et al. | |
| 2008/0017936 A1 | 1/2008 | Buchanan et al. | |
| 2008/0050870 A1 * | 2/2008 | Yamamoto | 438/230 |

* cited by examiner

*Primary Examiner* — Kenneth Parker
*Assistant Examiner* — Jose R Diaz
(74) *Attorney, Agent, or Firm* — Joseph Petrokaitis; Howard M. Cohn

(57) ABSTRACT

Embedded DRAM MOSFETs including an array NFET having a gate stack comprising a high-K dielectric layer upon which is deposited a first metal oxide layer (CD1) then a conductive layer (TiN), and then a polysilicon layer (Poly). A logic PFET having substantially the same gate stack as the array NFET, and a logic NFET having a third gate stack comprising the high-K dielectric layer upon which is deposited the conductive layer (TiN) and then the polysilicon layer (Poly), without the first metal oxide layer (CD1) between the high-K dielectric layer and the conductive layer (TiN). The array NFET may therefore have a higher gate stack work function than the logic NFET, but substantially the same gate stack work function as the logic PFET.

12 Claims, 4 Drawing Sheets

WORK FUNCTION ENGINEERING FOR EDRAM MOSFETS

FIELD OF THE INVENTION

The invention relates to semiconductor devices and, more particularly to the fabrication of field effect transistors (FETs), such as for dynamic random access memory (DRAM), such as embedded DRAM (eDRAM).

BACKGROUND OF THE INVENTION

The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals. One type of transistor is known as the field effect transistor (FET).

The terminals of a field effect transistor (FET) are commonly named source, gate and drain. In the FET, a small amount of voltage is applied to the gate (G) in order to control current flowing between the source (S) and drain (D). In FETs, the main current appears in a narrow conducting channel formed near (usually primarily under) the gate. This channel connects electrons from the source terminal to the drain terminal. The channel conductivity can be altered by varying the voltage applied to the gate terminal or by enlarging or constricting the conducting channel and thereby controlling the current flowing between the source and the drain.

FIG. 1 illustrates a FET 100 comprising a p-type substrate (or a p-well in the substrate), and two spaced-apart n-type diffusion areas—one of which will serve as the "source", the other of which will serve as the "drain" of the transistor.

The space between the two diffusion areas is called the "channel". The channel is where current flows, between the source (S) and the drain (D). A schematic symbol for an n-channel MOSFET appears to the left of FIG. 1.

A thin dielectric layer is disposed on the substrate above the channel, and a "gate" structure (G) is disposed over the dielectric layer, thus also atop the channel. (The dielectric under the gate is also commonly referred to as "gate oxide" or "gate dielectric".)

Electrical connections (not shown) may be made to the source (S), the drain (D), and the gate (G). The substrate may be grounded or biased at a desired voltage depending on applications.

Generally, when there is no voltage applied to the gate, there is no electrical conduction (connection) between the source and the drain. As voltage (of the correct polarity, plus or minus) is applied to the gate, there is a "field effect" in the channel between the source and the drain, and current can flow between the source and the drain. This current flowing in the channel can be controlled by the voltage applied to the gate. In this manner, a small signal (gate voltage) can control a relatively large signal (current flow between the source and the drain).

The FET 100 is exemplary of a MOSFET (metal oxide semiconductor FET) transistor. With the specified "n" and "p" types shown above, an "n-channel MOSFET" can be formed. With opposite polarities (swapping "p" for "n" in the diffusions, and "n" for "p" in the substrate or well), a p-channel FET can be formed. In CMOS (complementary metal oxide semiconductor), both n-channel and p-channel MOS transistors are used, and are often paired with one another.

While particular n- and p-type dopants may described herein according to NMOS technology, it is to be appreciated that one or more aspects of the present invention are equally applicable to forming a PMOS (generally, simply by reversing the n- and p-type dopants).

An integrated circuit (IC) device may comprise many millions of FETs on a single semiconductor "chip" (or "die"), measuring only a few centimeters on each side. Several chips may be formed simultaneously, on a single "wafer", using conventional semiconductor fabrication processes including deposition, doping, photolithography, and etching.

DRAM and eDRAM

Dynamic random access memory (DRAM) is a type of random access memory that stores each bit of data in a separate capacitor within an integrated circuit. Since real capacitors leak charge, the information eventually fades unless the capacitor charge is refreshed periodically. Because of this refresh requirement, it is a dynamic memory as opposed to static random access memory (SRAM) and other static memory. Its advantage over SRAM is its structural simplicity: only one transistor and a capacitor are required per bit, compared to (typically) six transistors in SRAM. This allows DRAM to reach very high density. Like SRAM, DRAM is in the class of volatile memory devices, since it loses its data when the power supply is removed. In general, a DRAM cell comprises an access transistor (or memory cell), and a storage capacitor.

Embedded DRAM (eDRAM) is a capacitor-based dynamic random access memory usually integrated on the same die or in the same package as the main ASIC or processor, as opposed to external DRAM modules and transistor-based SRAM typically used for caches.

Embedded dynamic random access memory (eDRAM) has its memory cells and its logic cells formed on a single silicon chip. eDRAM is capable of transferring large quantity of data at a very high speed. Due to its high memory capacity and speed, eDRAM has been used inside high volume processing circuits, an example of which is a graphic processor. A complete embedded DRAM includes logic circuits, a transfer field effect transistor (transfer FET) and a capacitor coupled to the transfer FET. The transfer FET actually acts as a switch between the lower electrode of the capacitor and a bit line. Therefore, data within the capacitor can be written in or read out.

FIG. 2 illustrates an exemplary eDRAM cell 200 of the prior art. On the right is a DRAM cell 210, and on the left is a logic transistor 220. Related contacts and interconnects for wiring the logic transistor 220 to the DRAM cell 210 are omitted, for illustrative clarity.

The DRAM cells and the logic circuits of an embedded DRAM are formed above a substrate 202 on a single chip. Normally, the substrate is a P-type silicon substrate. In general, device isolation regions 204 are formed using a local oxidation of silicon (LOCOS) method.

Alternatively, devices can be isolated by forming shallow trench isolation (STI) structures. Shallow trench isolation structures are formed by first etching out a trench, and then depositing oxide material into the trench using a chemical vapor deposition method.

The DRAM cell 210 and the logic transistor 220 are both essentially FETs, each comprising source/drain diffusions in the substrate 202 and a gate stack on the substrate between the source/drain diffusions.

In general, the logic circuit area and the memory cell area in an embedded DRAM have different gate structures. The gate of a DRAM cell normally comprises a tungsten silicide layer and a polysilicon layer, while the gate in a logic circuit area comprises a metal silicide layer and a polysilicon layer.

The DRAM cell 210 has a gate stack 212 comprising (from bottom, up) a gate oxide layer, a polysilicon layer, a metallic silicide layer and a silicon nitride gate cap layer. The DRAM cell 210 has source/drain regions 214. Sidewall spacers 216 may be formed on the gate stack 212. The memory transistor 210 is typically an NFET, and may also be referred to as a memory transistor, or an Array NFET.

The logic transistor 220 has a gate stack 222 comprising (from bottom, up) a gate oxide layer, a polysilicon layer, a metallic silicide layer and a silicon nitride gate cap layer. The logic transistor 220 has source/drain regions 224. Sidewall spacers 226 may be formed on the gate stack 222. The logic transistor 220 may have a self-aligned silicide layer 228.

The single logic transistor 220 shown is exemplary of either PFET or NFET, such as may both be used in CMOS logic circuitry for operating the DRAM cell 210.

A thick dielectric layer 230 is formed over the substrate 202, and then a contact opening 232 is formed in the dielectric layer 230 exposing one of the source/drain regions 214 of the memory transistor 210. Next, a conductive layer 234, a dielectric thin film 236 and another conductive layer 238 are sequentially formed above the substrate 202. Hence, a capacitor 240 having electrical connection with the source/drain region 214 of the memory transistor 210 is formed.

Glossary

Unless otherwise noted, or as may be evident from the context of their usage, any terms, abbreviations, acronyms or scientific symbols and notations used herein are to be given their ordinary meaning in the technical discipline to which the invention most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

When glossary terms (such as abbreviations) are used in the description, no distinction should be made between the use of capital (uppercase) and lowercase letters. For example "ABC", "abc" and "Abc", or any other combination of upper and lower case letters with these 3 letters in the same order, should be considered to have the same meaning as one another, unless indicated or explicitly stated to be otherwise. The same commonality generally applies to glossary terms (such as abbreviations) which include subscripts, which may appear with or without subscripts, such as "$X_{yz}$" and "Xyz". Additionally, plurals of glossary terms may or may not include an apostrophe before the final "s"—for example, ABCs or ABC's.

| | |
|---|---|
| CMOS | short for complementary metal oxide semiconductor. CMOS consists of n-channel and p-channel MOS transistors. Due to very low power consumption and dissipation as well as minimization of the current in "off" state, CMOS is a very effective device configuration for implementation of digital functions. CMOS is a key device in state-of-the-art silicon microelectronics. CMOS Inverter: A pair of two complementary transistors (a p-channel and an n-channel) with the source of the n-channel transistor connected to the drain of the p-channel transistor, and the gates connected to each other. The output (drain of the p-channel transistor) is high whenever the input (gate) is low and the other way round. The CMOS inverter is the basic building block of CMOS digital circuits.<br>NMOS: n-channel CMOS.<br>PMOS: p-channel CMOS. |
| DRAM | short for dynamic random access memory. DRAM is a type of random access memory that stores each bit of data in a separate capacitor within an integrated circuit. Since real capacitors leak charge, the information eventually fades unless the capacitor charge is refreshed periodically. Because of this refresh requirement, it is a dynamic memory as opposed to SRAM and other static memory. Its advantage over SRAM is its structural simplicity: only one transistor and a capacitor are required per bit, compared to six transistors in SRAM. This allows DRAM to reach very high density. Like SRAM, it is in the class of volatile memory devices, since it loses its data when the power supply is removed. |
| eDRAM | short for embedded DRAM. eDRAM is a capacitor-based dynamic random access memory usually integrated on the same die or in the same package as the main ASIC or processor, as opposed to external DRAM modules and transistor-based SRAM typically used for caches. |
| FET | short for field effect transistor. The FET is a transistor that relies on an electric field to control the shape and hence the conductivity of a "channel" in a semiconductor material. FETs are sometimes used as voltage-controlled resistors. The terminals of FETs are designated source (S), drain (D) and gate (G). Corresponding voltages applied to these terminals may be referred to as Vs, Vd, Vg, respectively. Substrate voltage may also play a role in FET operation. |
| MOS | short for metal oxide semiconductor. |
| MOSFET | short for metal oxide semiconductor field-effect transistor. MOSFET is by far the most common field-effect transistor in both digital and analog circuits. The MOSFET is composed of a channel of n-type or p-type semiconductor material, and is accordingly called an NMOSFET or a PMOSFET. (The 'metal' in the name is an anachronism from early chips where gates were metal; modern chips use polysilicon gates, but are still called MOSFETs). |
| NFET | short for Negative Channel (or n-polarity) Field Effect Transistor. An NFET is usually formed in a p-well (p-doped cell well). |
| PFET | short for Positive Channel (or p-polarity) Field Effect Transistor. A PFET is usually formed in an n-well (n-doped cell well). |
| Vt | short for threshold voltage. The threshold voltage of a MOSFET is usually defined as the gate voltage where an inversion layer forms at the interface between the insulating layer (oxide) and the substrate (body) of the transistor. |
| work function | The work function is the minimum energy (usually measured in electron volts) needed to remove an electron from a solid to a point immediately outside the solid surface (or energy needed to move an electron from the Fermi energy level into vacuum). Here "immediately" means that the final electron position is far from the surface on the atomic scale but still close to the solid on the macroscopic scale. The work function is an important property of metals. The magnitude of the work function is usually about a half of the ionization energy of a free atom of the metal |

SUMMARY OF THE INVENTION

According to an embodiment of the invention, embedded DRAM MOSFETs comprise: an array NFET having a gate stack comprising a high-K dielectric layer upon which is deposited a first metal oxide layer (CD1) upon which is deposited a conductive layer (TiN), upon which is deposited a polysilicon layer (Poly); a logic PFET having a second gate stack comprising the high-K dielectric layer upon which is deposited the first metal oxide layer (CD1) upon which is deposited the conductive layer (TiN), upon which is deposited the polysilicon layer (Poly); a logic NFET having a third gate stack comprising the high-K dielectric layer upon which is deposited the conductive layer (TiN), upon which is deposited the polysilicon layer (Poly), without the first metal oxide layer (CD1) between the high-K dielectric layer and the conductive layer (TiN).

According to an embodiment of the invention, a method of manufacturing embedded DRAM comprises the steps of:

providing a semiconductor substrate having a surface; defining a first area of the substrate for forming an array NFET, a second area of the substrate for forming a logic PFET and a third area of the substrate for forming a logic NFET; depositing a high-K dielectric layer on the surface of the substrate, in all three areas; depositing a first metal oxide layer (CD1) on the high-K dielectric layer, in all three areas; removing the first metal oxide layer (CD1) from the third (logic NFET) area of the substrate; depositing a conductive layer (TiN) on the surface of the substrate, in all three areas; depositing a layer of polysilicon on the surface of the substrate, in all three areas; and patterning the layers to form gate stacks for an array NFET in the first area of the substrate, a logic PFET in the second area of the substrate, and a logic NFET in the third area of the substrate.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

If shading or cross-hatching is used, it is intended to be of use in distinguishing one element from another (such as a cross-hatched element from a neighboring un-shaded element. It should be understood that it is not intended to limit the disclosure due to shading or cross-hatching in the drawing figures.

In some of the figures, particularly cross-sectional views of semiconductor devices in various stages of fabrication, some elements may be drawn with very straight edges intersecting with other edges at precise (such as 90-degree) angles, for illustrative clarity. One of ordinary skill in the art will appreciate that the edges may not be so straight, and the intersections may be rounded, due to the nature of the processes (such as etching) used to form the various elements of the semiconductor devices.

Figure 1:
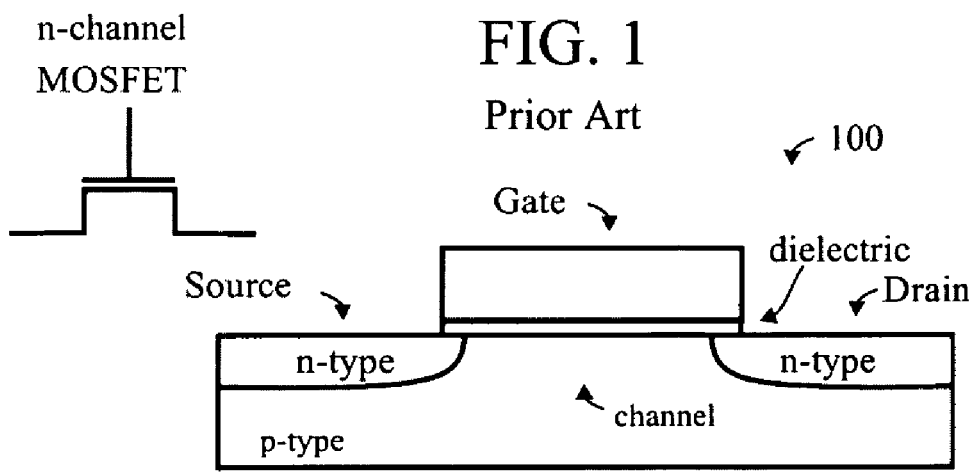
Figure 2:
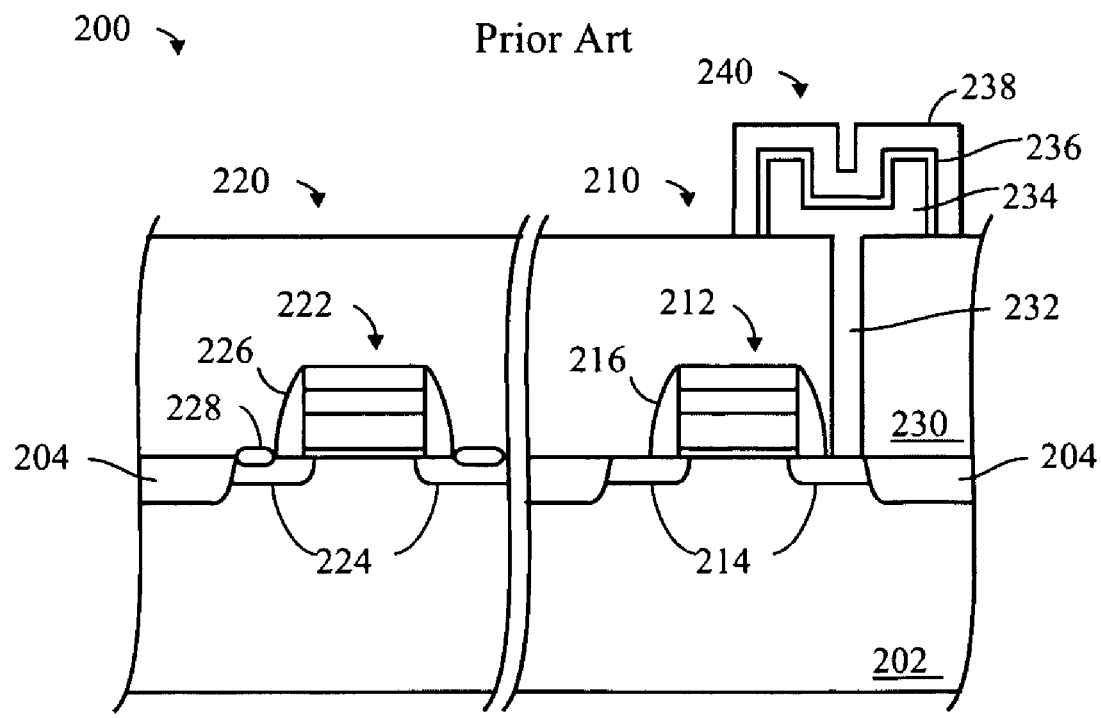

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199a, 199b, 199c, etc. Such relationships, if any, between similar elements in the same or different figures will become apparent throughout the specification, including, if applicable, in the claims and abstract.

Conventional electronic components may be labeled with conventional schematic-style references comprising a letter (such as A, C, Q, R) indicating the type of electronic component (such as amplifier, capacitor, transistor, resistor, respectively) followed by a number indicating the iteration of that element (such as "1" meaning a first of typically several of a given type of electronic component). Components such as resistors and capacitors typically have two terminals, which may be referred to herein as "ends". In some instances, "signals" are referred to, and reference numerals may point to lines that carry said signals. In the schematic diagrams, the various electronic components are connected to one another, as shown. Usually, lines in a schematic diagram which cross over one another and there is a dot at the intersection of the two lines are connected with one another, or else (if there is no dot at the intersection) they are typically not connected with one another.

In the drawings accompanying the description that follows, both reference numerals and legends (labels, text descriptions) may be used to identify elements. If legends are provided, they are intended merely as an aid to the reader, and should not in any way be interpreted as limiting.

FIG. 1 is a cross-sectional view of an FET, according to the prior art.

FIG. 2 is a cross-sectional view of eDRAM comprising a DRAM cell (transistor plus capacitor) and an associated logic transistor, according to the prior art.

FIGS. 3A-3F are simplified cross-sectional views of an array transistor of a DRAM cell and associated logic NFET and PFET, and method of making same, according to the invention.

DETAILED DESCRIPTION OF THE INVENTION

The leakage for EDRAM array transistor is very critical to make good retention time. Junction leakage is a critical component of the total leakage. High doping in the channel is needed for array transistor to make enough High Vt (>0.8V, logic NFET Vt is below 0.5V) to reduce the subthreshold leakage which can increase the junction leakage. In this disclosure, the gate stack with work function away from conduction band is used for the array transistor, therefore high Vt can be achieved without high channel doping. With low channel doping, the junction leakage and Vt mismatch can be reduced.

According to the invention, generally, for EDRAM, a metal oxide cap is added over the gate dielectric layer of the EDRAM array device (or "memory transistor") to move the workfunction of the memory transistor close to the valence band edge, to increase the Vt of the EDRAM array device, with low or no channel doping. The metal oxide cap (CD1) may comprise aluminum oxide.

Therefore:

Junction leakage can be reduced significantly.

Vt variability caused by random dopant fluctuation can be reduced with low channel doping.

The memory transistor may be an NFET. An associated logic PFET may have the same gate stack as the NFET memory transistor—namely, a thin metal oxide layer inserted between a high K (HK) gate dielectric and metal gate (MG) to modulate the work function of the MOSFET.

The work function of HK+MG (without the metal oxide) is different from HK+metal oxide+MG, because with the thin metal oxide, the workfunction of the gate stack is close to the valence band (Ev) which is generally good for the logic PFET, but not good for NFET.

An associated logic NFET does not have the metal oxide layer between the high K gate dielectric and metal gate. The metal oxide layer favors the logic PFET, not the logic NFET.

The metal oxide inserted between the HK and the MG results in a higher Vt for EDRAM array NFET, and a lower Vt for the logic PFET.

The EDRAM array NFET may therefore have a higher gate stack work function than the logic NFET, but may have substantially the same gate stack work function as the logic PFET.

The EDRAM NFET Vt usually is more than 300-500 mV higher than logic NFET. In the prior art, higher doping in the channel is needed to achieve higher Vt in EDRAM array transistor compared with logic NFET which can increase the junction leakage. In the present invention, high array transistor Vt can be achieved by the work function of the gate stack.

In the present invention, the work function of the EDRAM NFET is made different from that of the doped poly.

In the present invention, metal oxide is put on the EDRAM NFET to make work function away from band edge.

The first metal oxide layer (CD1) may comprise aluminum oxide or aluminum nitride, and may have a thickness of 0.2-1.0 nm.

A second metal oxide layer (CD2) may be deposited between the high-K dielectric layer and the metal oxide layer (CD1) of the third gate stack of the logic NFET, and may comprise a material selected from the group consisting of LaOx, MgO, BaOx, and Y2O3.

The high-K dielectric layer may comprise a material selected from the group consisting of hafnium oxide (HfO2), HfSiON, ZrO2 and other high-K materials, and may have a thickness of 1-4 nm.

The conductive layer (TiN) may comprise titanium nitride, and may have a thickness of 5-15 nm.

The polysilicon layer may be doped as it is deposited, and may have a thickness of 50-100 nm.

After removing the first metal oxide layer (CD1) from the third (logic NFET) area of the substrate, a second metal oxide layer (CD2) may be deposited in the third (logic NFET) area of the substrate prior to depositing the conductive layer (TiN).

In the description that follows, numerous details are set forth in order to provide a thorough understanding of the present invention. It will be appreciated by those skilled in the art that variations of these specific details are possible while still achieving the results of the present invention. Well-known processing steps and materials are generally not described in detail in order to avoid unnecessarily obfuscating the description of the present invention.

Throughout the descriptions set forth in this disclosure, lowercase numbers or letters may be used, instead of subscripts. For example Vg could be written Vg. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceding it, such as "Vs" (source voltage) or "H2O" (water). For consistency of font size, such acronyms may be written in regular font, without subscripting, using uppercase and lowercase—for example "Vs" and "H2O".

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula SiO2. For example, silicon nitride (stoichiometrically Si3N4, often abbreviated as "SiN") may be referred to simply as "nitride".

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

As used herein, the term semiconductor fabrication or process or device may refer to standard CMOS processing and devices. CMOS is a widely used type of semiconductor product that uses both NMOS (negative polarity) and PMOS (positive polarity) devices and circuits. Generally, unless otherwise stated, the polarities of any device disclosed herein may be reversed, "p" for "n", which may (or may not) require that other associated devices are also implemented with opposite polarity.

As described hereinabove, EDRAM may generally comprise a DRAM cell having a memory (or array) transistor for the dynamic storage and evaluation of information on a cell capacitor, and associated CMOS logic circuitry comprising logic NFETs and logic PFETs. High-K (HK) gate dielectric and metal gate (MG) has been investigated to reduce gate leakage, improve performance and help gate length scaling.

It should be understood that band-edge (high performance logic) or close to band-edge work function (low power) gate stack may be effective to obtain appropriate device Vt and good short channel effect for logic circuit application.

For low power application, single metal gate HK-MG process has been used in which a metal-oxide cap is used to move the work function close to valence band edge.

It should be understood that the EDRAM memory transistor may have a much higher Vt (such as 300-500 mv) than the logic transistors, and junction leakage is very critical. The eDRAM memory transistor (device) channel length is much longer than for typical logic devices. Short channel effect (SCE) is not so critical for the eDRAM memory transistor. For the memory transistor, low or no channel doping can be used to move the gate stack work function away from the conduction band (Ec).

| Work Function and Vt | | |
|---|---|---|
| | -------------------- | Ec |
| $\Phi m$ | -------------------- | |
| | -------------------- | |
| | -------------------- | Ev |

$$Vt = \Phi m - \Phi s - Qox/Cox + 2\psi B + (4\epsilon_{si}qN\alpha\psi B)1/2/Cox$$

wherein:

| | |
|---|---|
| Ec | is conduction band |
| Ev | is valence |
| Φm | is the work function of the material forming the gate (metal function) |
| Φs | is the work function of the silicon substrate. |
| Qox | represents the charge in the gate dielectric |
| Cox | is the gate dielectric capacitance |
| ψB | is the difference of potential between Fermi's level and the intrinsic Fermi level |
| $\epsilon_{si}$ | is permittivity of Silicon |
| q | is the elementary charge |
| Na | is the doping concentration in the channel. |

Work Function of Different Gate Stacks

Different gate stacks are discussed herein. For each of the 3 transistors, four gate stacks are possible. In the table below, CD1 and CD2 are metal oxides. "CD" is short for capping dielectric.

| Stack | Info | Wfn (eV) |
|---|---|---|
| | Stack Modulation | |
| S1 | CD2/TiN | 4.05 |
| S2 | TiN | 4.5-4.7 |
| S3 | Ta(c)N | 4.8-4.9 |
| S4 | CD1/TiN | 4.9 |
| | Composition modulation | |
| S5 | TiN1(Ti-rich TiN) | 4.25-4.3 |
| S6 | TiN2 | 4.5-4-6 |
| S7 | TiN3 (N-rich) | 4.7 |
| S8 | CD1/TiN | 4.9 |
| | Thickness modulation | |
| S9 | TiN (2-5 nm) | 4.55 |
| S10 | TiN (10 nm) | 4.6 |
| S11 | TiN (20 nm) | 4.7 |
| S12 | TiN (30 nm) | 4.75 |

* logic PFET and EDRAM array transistor: CD1/TiN
* logic NFET: TiN
CD1 (metal oxide 1) is a capping dielectric toward logic PFET: Aluminum Oxide (Al2O3), Aluminum Nitride (AlN) CD1 may also be on memory NFET CD2 (metal oxide 2) is a capping dielectric for logic NFET: LaOx, MgO, BaOx, Y2O3

The table above shows how the work function can be modulated by metal oxide. For example, CD2 applied to the logic NFET can make the work function close to conduction band edge and reduce logic NFET Vt. For example it can make the gate stack work function 4.5-4.7V (TiN) to 4.05V (CD2+TiN).

A Process Flow for Forming EDRAM

FIGS. 3A-3G illustrate an exemplary process flow for forming (manufacturing) a memory transistor and associated CMOS logic transistors of an EDRAM cell 300. The three transistors comprise:
 a logic NFET 320
 an array NFET 330
 a logic PFET, 340

Figure 3A:
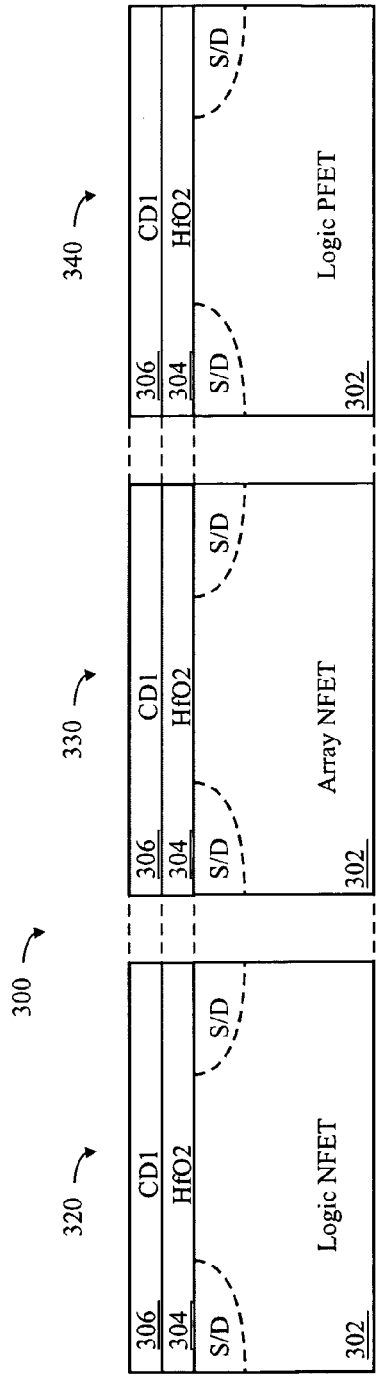

FIG. 3A illustrates a first step (high-K dielectric and first gate conductor deposition) of the process. Beginning with a silicon layer 302, which may be a bulk silicon substrate, or a silicon layer of a silicon-on-insulator (SOI) substrate, a high-K dielectric layer 304 is deposited on the surface of the substrate. The high-K dielectric layer 304 may comprise hafnium oxide (HfO2), and may have a thickness of 1-4 nm. The high-K dielectric layer 304 will serve as the gate dielectric for the three transistors 320, 330, 340. Each of the transistors 320, 330 and 340 will be formed in a respective area of the substrate, and may be isolated from each other by shallow trench isolation, for example. Other materials for the gate dielectric 304 may include, HfSiON, ZrO2 and other high-K materials.

Next, a conductive layer 306 is deposited on the high-K dielectric 304. The conductive layer 306, labeled "CD1" in the drawings, may comprise aluminum oxide (Al2O3), and may have a thickness of 0.2-1.0 nm. The conductive layer CD1 will serve as the gate electrode for the transistors 330 and 340. The transistor 320 will receive a different gate electrode material.

In subsequent steps, these two layers 304 and 306 will be patterned, forming gate stacks for the three transistors, each gate stack comprising a gate dielectric and a gate conductor. The gate stacks for the Array NFET 330 and the Logic PFET 340 will be substantially the same as one another. The gate stack for the Logic PFET 320 will be different than the other two.

Source/Drain diffusions (S/D) are shown in dashed lines. The formation of these diffusions will occur later in the process, after the gate stacks are formed.

Wells for the three transistors are omitted, for illustrative clarity. Separators, such as shallow trench isolation (STI) is also omitted, for illustrative clarity.

Figure 3B:
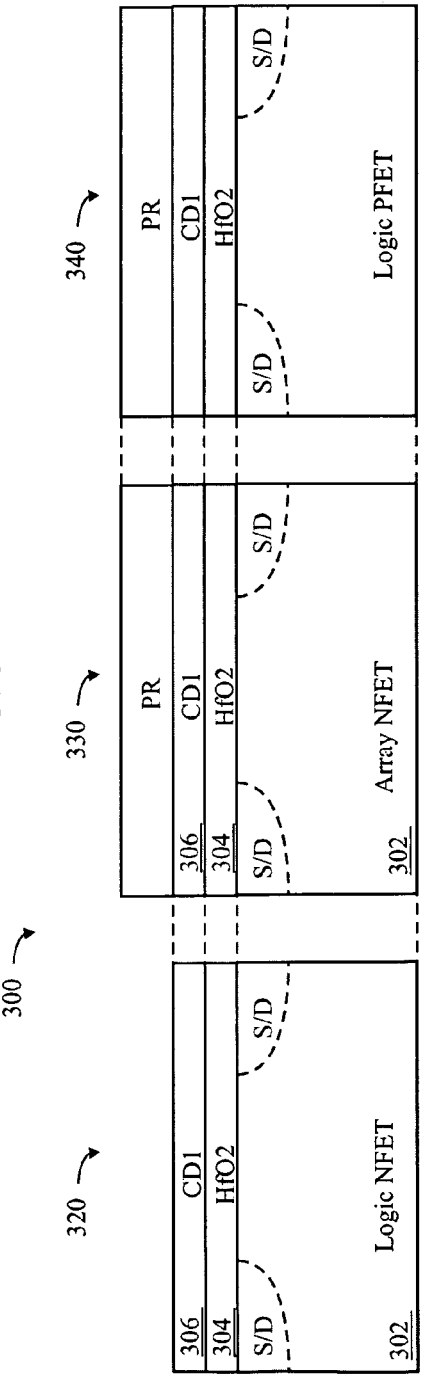
Figure 3C:
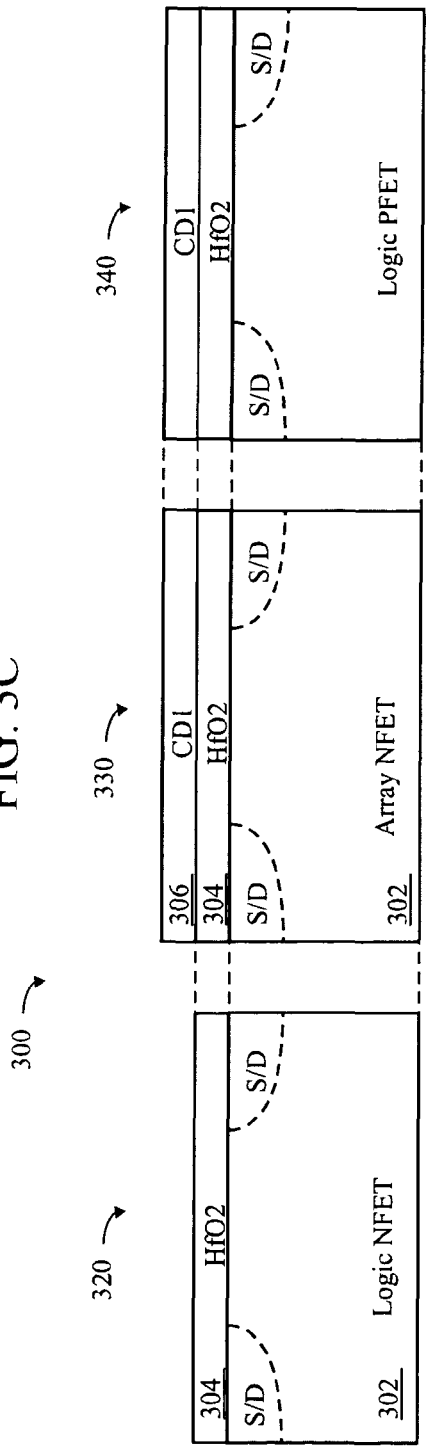

FIGS. 3B and 3C illustrate a next step (gate conductor etch) in the process.

First, as shown in FIG. 3B, a photoresist (PR) mask is applied and is patterned to cover only the Array FET 320 and the Logic PFET 330, leaving the Logic NFET 320 exposed.

Then, as shown in FIG. 3C, the gate conductor 306 (CD1, such as Al2O3) may be removed from the Logic NFET 320, using a suitable etchant such as HCL, leaving the gate dielectric 302 (HfO2) exposed (uncovered by gate conductor CD1) for the Logic NFET 320.

Figure 3D:
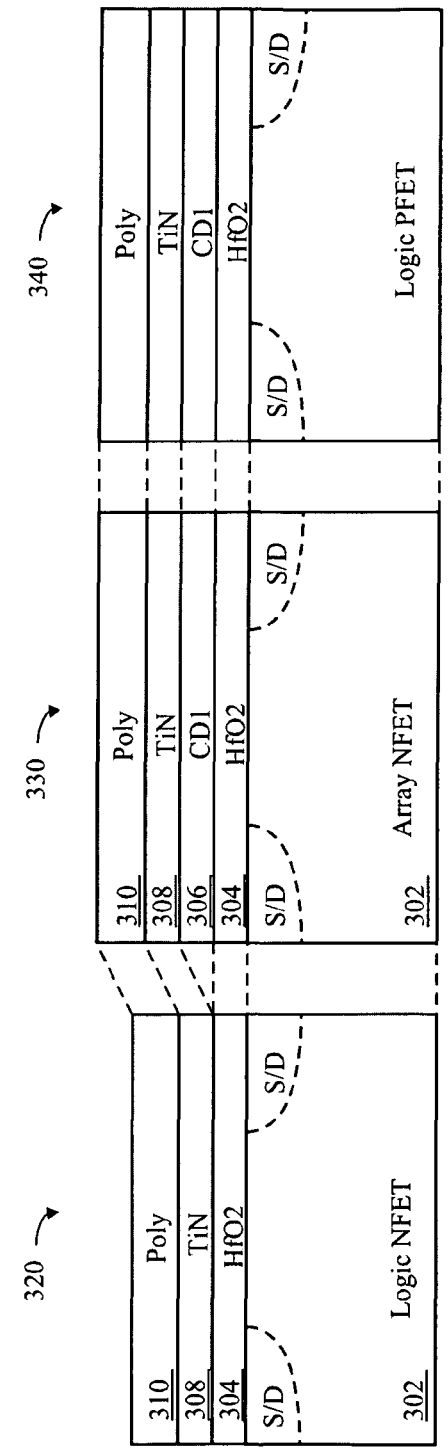

FIG. 3D illustrates next steps (second gate conductor and poly deposition) in the process.

First, a conductive layer 308 is deposited, covering all three transistors 320, 330 and 340. The conductive layer 308 is labeled "TiN" in the drawings, may comprise Titanium Nitride, and may have a thickness of 5-15 nm. The conductive layer may comprise TaC.

Then, a layer 310 of polysilicon (poly) may be deposited. The poly layer 310 may be doped (to be conductive) as it is deposited. The poly layer 310 may have a thickness of 50-100 nm.

Figure 3E:
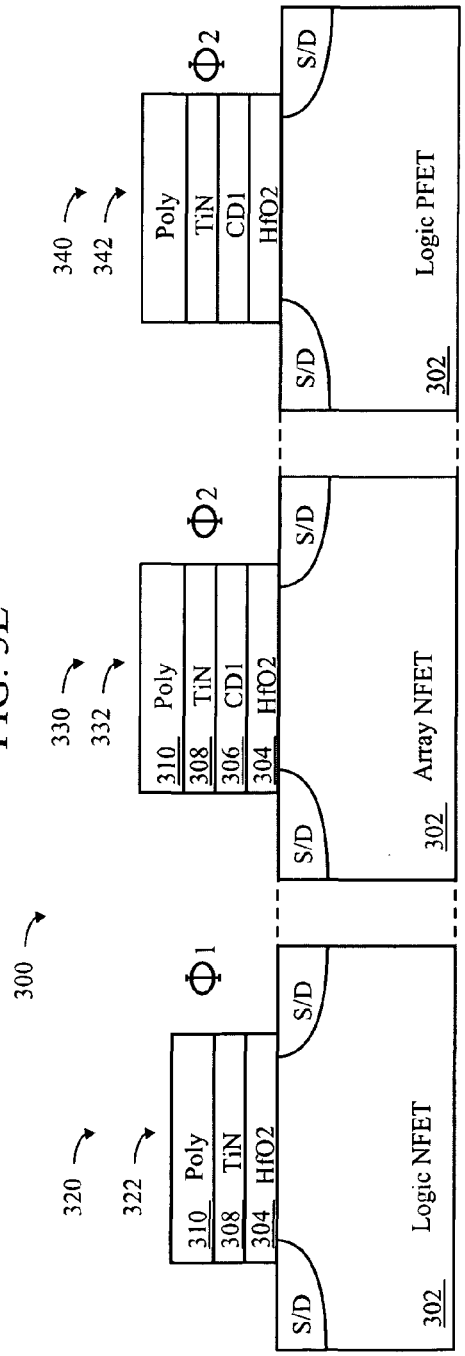

FIG. 3E illustrates next steps (gate patterning and etch) in the process. Using conventional lithographic techniques, the layers 304, 306, 308 and 310 are patterned, resulting in individual gate stacks 322, 332 and 342 for the three transistors 320, 330 and 340, respectively.

Then, sidewall spacers (not shown, refer to FIG. 2) may be applied, and the relevant source/drain implants (S/D) may be performed.

There has thus been shown a method of forming EDRAM comprising an array NFET and associated CMOS PFET and NFET. Several array NFETs and several logic PFETs and logic NFETs may all be formed on a common substrate. The gate stacks 332 and 342 for the Array NFET 330 and Logic PFET 340, respectively, have the same four layers of dielectric 304, conductor (CD1) 306, conductor (TiN) 308 and poly 310. And, that the Logic NFET 320 has a gate stack 322 without the conductor (CD1) 306. In this manner, the Vt of logic NFET is higher than the Vt of the array NFET. And, the work function of PFET gate stack is close to the band edge.

| | | |
|---|---|---|
| Logic NFET | Φ1 (work function 1) | |
|   Poly-Si | | |
|   TiN metal | | |
|   HfO2 high-K dielectric | | |
| EDRAM Array (memory) NFET | Φ2 (work function 2) | |
|   Poly-Si | | |
|   TiN | | |
|   CD1 a metal oxide HfO2 | | |
| Logic PFET | Φ2 (work function 2) | |
|   Poly-Si | | |
|   TiN | | |
|   CD1 | | |
|   HfO2 | | |

Same work function material with a CD1 cap for EDRAM array FET and the logic PFET.

No CD1 cap layer on logic NFET to get close to band edge work function gate stack and control the short channel effect.

200-300 mV work function delta between logic NFET and array NFET due to CD1 layer.

The following shows the effect of the gate stack on the logic NFET, the array NFET and the PFET.

| | | | |
|---|---|---|---|
| | -------------------- | Ec | 250 mv |
| Φ1 | -------------------- | | theta 1 is the work function |
| | -------------------- | ½ Eg | 500 mv |
| Φ2 | -------------------- | | 250 mv |
| | -------------------- | Ev | valence |

Figure 3F:
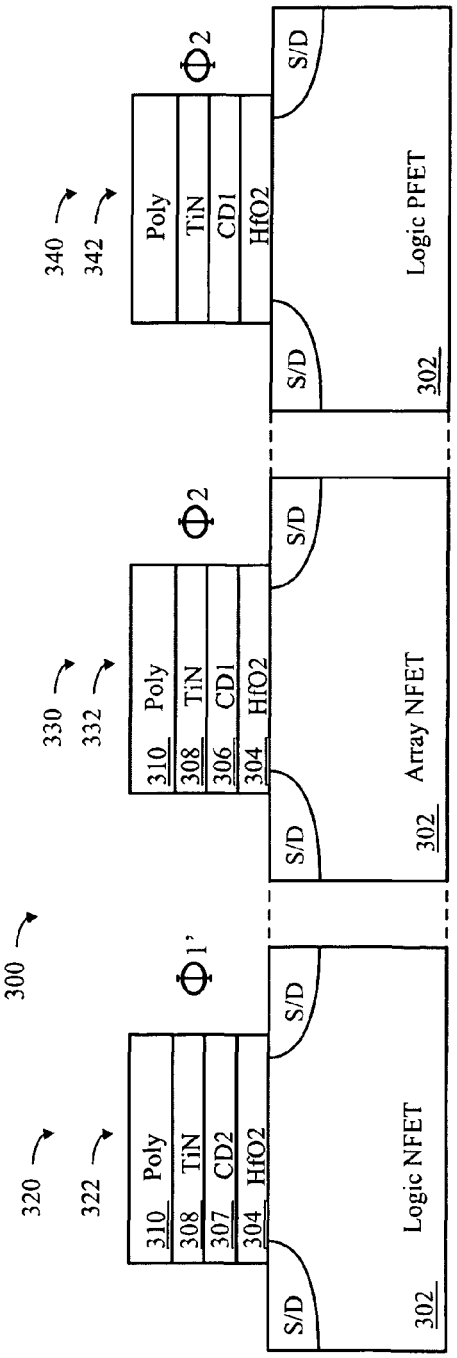

As shown in FIG. 3F, a thin metal oxide layer (CD2) 307 may optionally be added between the HK gate dielectric (HfO2) 304 and the metal gate (TiN) 308 for the logic NFET. This can be done after the step shown in FIG. 3B, with the photoresist (PR) covering the array NFET and logic PFET, and after the metal oxide layer (CD1) 306 is stripped (FIG. 3C), before the metal gate (TiN) 308 is deposited. The conductive layer 307 may have a thickness of 0.2-1.0 nm. This will, of course, alter the work function Φ1' of the logic NFET. (Φ1 is within 250 mV to conduction band edge)

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. Embedded DRAM MOSFETs comprising:
    an array NFET having a gate stack comprising a high-K dielectric layer upon which is deposited a first metal oxide layer (CD1) upon which is deposited a TiN conductive layer, upon which is deposited a polysilicon layer (Poly);
    a logic PFET having a second gate stack comprising the high-K dielectric layer upon which is deposited the first metal oxide layer (CD1) upon which is deposited the TiN conductive layer, upon which is deposited the polysilicon layer (Poly); and
    a logic NFET having a third gate stack comprising the high-K dielectric layer upon which is deposited the TiN conductive layer, upon which is deposited the polysilicon layer (Poly), without the first metal oxide layer (CD1) between the high-K dielectric layer and the conductive TiN layer.

2. The embedded DRAM MOSFETs of claim 1, further comprising:
    a second metal oxide layer (CD2) deposited between the high-K dielectric layer and the first metal oxide layer (CD1) of the third gate stack of the logic NFET.

3. The embedded DRAM MOSFETs of claim 1, wherein:
    the second metal oxide layer (CD2) for the logic NFET comprises a material selected from the group consisting of LaOx, MgO, BaOx, and Y2O3.

4. The embedded DRAM MOSFETs of claim 1, wherein:
    the first metal oxide layer (CD1) has a thickness of 0.2-1.0 nm.

5. The embedded DRAM MOSFETs of claim 1, wherein:
    the high-K dielectric layer comprises a material selected from the group consisting of hafnium oxide (HfO2), HfSiON, ZrO2 and other high-K materials.

6. The embedded DRAM MOSFETs of claim 1, wherein:
    the high-K dielectric layer has a thickness of 1-4 nm.

7. The embedded DRAM MOSFETs of claim 1, wherein:
    the first metal oxide layer (CD1) comprises aluminum oxide or aluminum nitride.

8. The embedded DRAM MOSFETs of claim 1, wherein:
    the first metal oxide layer (CD1) has a thickness of 0.2-1.0 nm.

9. The embedded DRAM MOSFETs of claim 1, wherein:
    the TiN conductive layer comprises titanium nitride.

10. The embedded DRAM MOSFETs of claim 1, wherein:
    the TiN conductive layer has a thickness of 5-15 nm.

11. The embedded DRAM MOSFETs of claim 1, wherein:
    the polysilicon layer is doped as it is deposited.

12. The embedded DRAM MOSFETs of claim 1, wherein:
    the polysilicon layer has a thickness of 50-100 nm.

* * * * *